US010062454B1

(12) United States Patent
Merugu et al.

(10) Patent No.: US 10,062,454 B1
(45) Date of Patent: Aug. 28, 2018

(54) CONFIGURABLE SYSTEM AND METHOD FOR DEBUGGING A CIRCUIT

(71) Applicant: Xilinx, Inc., San Jose, CA (US)

(72) Inventors: Ushasri Merugu, Hyderabad (IN); Mahesh Sankroj, Secunderabad (IN); Sudheer K. Koppolu, Hyderabad (IN); Siva V. N. Hemasunder Tallury, Hyderabad (IN)

(73) Assignee: XILINX, INC., San Jose, CA (US)

( * ) Notice: Subject to any disclaimer, the term of this patent is extended or adjusted under 35 U.S.C. 154(b) by 89 days.

(21) Appl. No.: 15/372,301

(22) Filed: Dec. 7, 2016

(51) Int. Cl.
  *G11C 29/52* (2006.01)
  *G06F 1/12* (2006.01)
(52) U.S. Cl.
  CPC ............. *G11C 29/52* (2013.01); *G06F 1/12* (2013.01)
(58) Field of Classification Search
  CPC .................................. G11C 29/52; G06F 1/12
  See application file for complete search history.

(56) References Cited

U.S. PATENT DOCUMENTS

| | | | | |
|---|---|---|---|---|
| 9,513,334 B2* | 12/2016 | Shanker | ........... | G01R 31/31705 |
| 2004/0193936 A1* | 9/2004 | Kelly | ........... | G06F 5/06 |
| | | | | 713/500 |
| 2005/0149892 A1* | 7/2005 | Yee | ........... | G01R 31/31705 |
| | | | | 716/113 |
| 2008/0034246 A1* | 2/2008 | Kelly | ........... | G06F 5/06 |
| | | | | 713/500 |
| 2010/0268978 A1* | 10/2010 | Kelly | ........... | G06F 5/06 |
| | | | | 713/500 |
| 2010/0332909 A1* | 12/2010 | Larson | ........... | G06F 11/3476 |
| | | | | 714/40 |
| 2014/0053027 A1* | 2/2014 | Nixon | ........... | G06F 11/3656 |
| | | | | 714/45 |
| 2014/0281775 A1* | 9/2014 | Shanker | ........... | G01R 31/31705 |
| | | | | 714/727 |

OTHER PUBLICATIONS

Cummings, Clifford E, "Clock Domain Crossing (CDC) Design & Verification Techniques Using SystemVerilog", SNUG-2008, Sep. 26, 2008, pp. 1-56, Rev. 1.0, Boston, MA.
Jain, Tejas DaveAmit et al., "Synchronizer techniques for multi-clock domain SoCs & FPGAs", EDN Network, Sep. 30, 2014, pp. 1-8, EDN Network.

* cited by examiner

*Primary Examiner* — Thien Nguyen
(74) *Attorney, Agent, or Firm* — LeRoy D. Maunu

(57) ABSTRACT

Disclosed approaches for probing signals in a plurality of clock domains include inputting unsynchronized trigger signals from the plurality of clock domains to a plurality of instances of a multi-synchronizer circuit, respectively. Each instance of the multi-synchronizer circuit includes a plurality of synchronizer circuits. One or more of the plurality of synchronizer circuits synchronizes the respective unsynchronized trigger signal with one clock signal from the plurality of clock domains. Output of one of the one or more synchronizer circuits in each instance of the multi-synchronizer circuit is selected as a respective synchronized trigger signal. A trigger equation is evaluated based on a state of each respective synchronized trigger signal. A final trigger signal is generated based the evaluating of the trigger equation, a trigger marker is stored in a memory in response to a state of the final trigger signal, and states of probed signals are stored in the memory.

20 Claims, 8 Drawing Sheets

CONFIGURABLE SYSTEM AND METHOD FOR DEBUGGING A CIRCUIT

TECHNICAL FIELD

The disclosure generally relates to systems that support debugging a circuit.

BACKGROUND

In-circuit emulators and logic analyzers are often used with programmable logic devices in testing and debugging circuits. Testing and debugging generally entails running the circuit, applying input stimuli, and checking the states of selected signals in the circuit.

In one approach, a programmable integrated circuit includes programmable logic and interconnect resources that are configured to implement the circuit-under-test and a logic analyzer circuit. The logic analyzer circuit receives signals from the circuit-under-test. The signals include trigger signals and data signals. The trigger signals are used to control the initiation of sampling of states of the data signals. The states of the data signals may be logged into the on-chip memory of the programmable integrated circuit. The sampled data may then be sent to a host computer system via a boundary scan interface that is connected to the on-chip memory. Software executing on the host computer system displays the sampled data and provides a mechanism to adjust the trigger and probe data selection via the boundary scan interface.

SUMMARY

A disclosed circuit for probing signals in a plurality of clock domains includes a plurality of instances of a multi-synchronizer circuit. Each instance of the multi-synchronizer circuit is configured and arranged to input a respective unsynchronized trigger signal from a respective one of the plurality of clock domains, and each instance of the multi-synchronizer circuit includes a plurality of synchronizer circuits and control circuitry. Each of the plurality of synchronizer circuits is configured to synchronize the respective unsynchronized trigger signal with one clock signal from the plurality of clock domains and to output a synchronized trigger signal. The control circuitry is configured and arranged to select the synchronized trigger signal from one of the plurality of synchronizer circuits as a respective synchronized trigger signal. The circuit for probing further includes a trigger circuit coupled to the plurality of instances of the multi-synchronizer circuit and configured and arranged to evaluate a trigger equation based on states of the respective synchronized trigger signals and output a final trigger signal based on evaluation of the trigger equation. A memory has a data port coupled to input data indicative of states of the signals in the multiple clock domains. A capture controller circuit is coupled to the memory and is configured and arranged to generate addresses to an address port of the memory. A trigger capture circuit is coupled to the memory and to the trigger circuit and is configured and arranged to store a trigger marker in the memory in response to a state of the final trigger signal.

A disclosed method of probing signals in a plurality of clock domains includes inputting unsynchronized trigger signals from the plurality of clock domains to a plurality of instances of a multi-synchronizer circuit, respectively. Each instance of the multi-synchronizer circuit includes a plurality of synchronizer circuits. The method further includes synchronizing, by one or more of the plurality of synchronizer circuits in each instance of the multi-synchronizer circuit, the respective unsynchronized trigger signal with one clock signal from the plurality of clock domains. Output of one of the one or more synchronizer circuits in each instance of the multi-synchronizer circuit is selected as a respective synchronized trigger signal. A trigger equation is evaluated based on a state of each respective synchronized trigger signal. The method further generates a final trigger signal based on the evaluating of the trigger equation, stores a trigger marker in a memory in response to a state of the final trigger signal, and stores states of probed signals in the memory.

Other features will be recognized from consideration of the Detailed Description and Claims, which follow.

BRIEF DESCRIPTION OF THE DRAWINGS

Various aspects and features of the disclosed methods and systems will become apparent upon review of the following detailed description and upon reference to the drawings in which.

DETAILED DESCRIPTION

Figure 1:
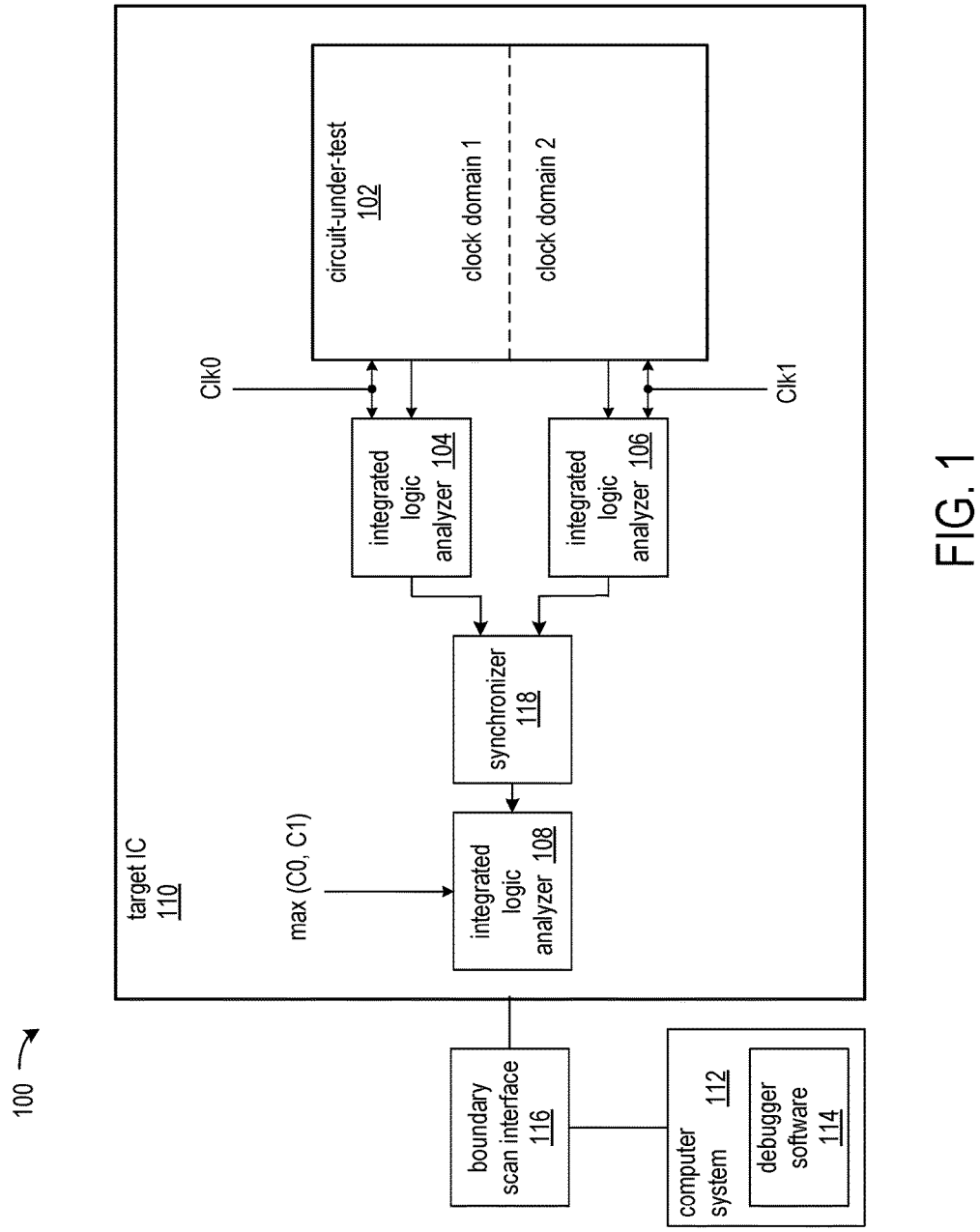
FIG. 1 shows a circuit diagram of a prior system in which a circuit-under-test is probed by a logic analyzer circuitry.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed circuits and methods employ a single integrated logic analyzer to probe circuit-under-test in multiple clock domains. The single integrated logic analyzer includes multiple instances of a multi-synchronizer circuit. Each instance of the multi-synchronizer circuit is configured and arranged to input an unsynchronized trigger signal from one of the clock domains, and each instance of the multi-synchronizer circuit includes multiple synchronizer circuits and control circuitry. Each of the synchronizer circuits synchronizes the input unsynchronized trigger signal with one of two clock signals and outputs a synchronized trigger signal. The control circuitry selects the synchronized trigger signal from one of the synchronizer circuits as a synchronized trigger signal. A trigger circuit evaluates a trigger equation based on states of the synchronized trigger signals and outputs a final trigger signal based on evaluation of the trigger equation. A memory has a data port coupled to input data indicative of states of the signals in the multiple clock domains. A capture controller circuit generates addresses to an address port of the memory, and a trigger capture circuit stores a trigger marker in the memory in response to a state of the final trigger signal.

FIG. 1 shows a circuit diagram of a prior system 100 in which a circuit-under-test 102 is probed by logic analyzer circuitry that includes integrated logic analyzer 104, which is coupled to the circuitry in clock domain 1 of the circuit-under-test, integrated logic analyzer 106, which is coupled to the circuitry in clock domain 2 of the circuit-under-test, and integrated logic analyzer 108, which is coupled to receive output signals from the integrated logic analyzers 104 and 106.

The circuit-under-test is implemented on target IC 110, such as a programmable IC. The target IC is communicatively coupled to a computer system 112. The circuit-under-test 102 and the logic analyzer circuits 104, 106, and 108 are implemented on the target IC, and a debugger program 114 executes on the computer system 112 and controls a debug scenario in response to user inputs. The debugger program provides a user interface for input of data to control the sampling and communicates with the integrated logic analyzer 108 via boundary scan interface circuitry 116, through which signals are applied to the logic analyzer circuitry to select the signals to probe and specify trigger logic. The logic analyzer circuitry samples probed signals, stores the sampled states of the probed signals, and reads the sampled and stored states of the probed signals.

The integrated logic analyzer circuitry in system 100 has multiple stages to accommodate probing signals in the different clock domains of the circuit-under-test 102. Integrated logic analyzers 104 and 106 in the first stage perform trigger and capture operations on signals of the clock domain 1 portion and the clock domain 2 portion of the circuit-under-test. The circuitry in clock domain 1 is clocked by clock signal Clk0, and the circuitry in clock domain 2 is clocked by clock signal Clk1.

In each of the first-stage integrated logic analyzers 104 and 106, a comparator circuit compares each input signal from the respective clock domain to a specific value, and a trigger circuit evaluates trigger equations using output signals from the comparator circuits. The comparison and trigger in integrated logic analyzer 104 are clocked by Clk0, and the comparison and trigger in integrated logic analyzer 106 are clocked by Clk1.

The second stage integrated logic analyzer 108 is used to evaluate a trigger equation that involves signal states from different clock domains. The example circuit-under-test 102 has two clock domains. However, other circuits may have more than two clock domains, and a trigger equation may involve signal states from more than two clock domains.

In order to evaluate the trigger equation involving signal states from different clock domains, system 100 requires a user-provided synchronizer circuit 118 to first synchronize the signals from the different clock domains. The synchronizer circuit 118 synchronizes the input trigger signals from the integrated logic analyzers 104 and 106 to the faster of the clock signals Clk0 and Clk1. The designer seeking to debug the circuit-under-test must design the synchronizer according to the frequency/phase relationships of the different clock domains. For more than two clock domains, the synchronizer design may be especially complex.

Figure 2:
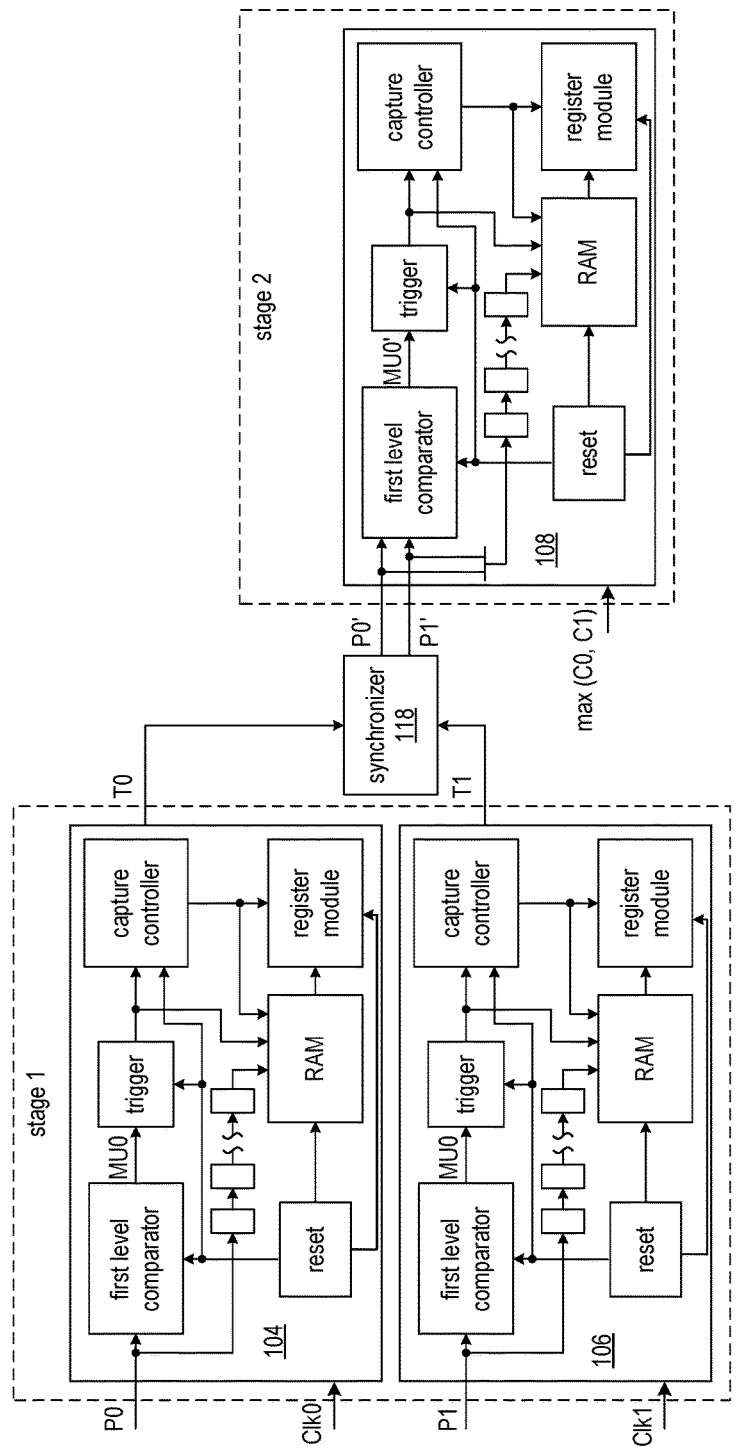
FIG. 2 shows the two stages of logic analyzer circuitry of FIG. 1 and the significant number of circuit resources used to implement the two stages.

The second stage integrated logic analyzer circuit inputs synchronized trigger signals and is clocked by the clock signal having the greatest frequency. Once all the events in the first and second stages are complete, the integrated logic analyzers signal the debugger software 114 to read out the captured data along with trigger marks. The sampled data is sent to the host computer system 112 via the boundary scan interface 116 when the trigger condition is satisfied or data is requested. The debugger software displays the sampled data and provides means for generating the trigger condition in different Waveforms windows FIG. 2 shows the two stages of logic analyzer circuitry of FIG. 1 and the significant number of circuit resources used to implement the two stages. Stage 1 includes integrated logic analyzers 104 and 106 and stage 2 include integrated logic analyzer 108. In the first stage every signal (or "probe port") is associated with a comparator circuit to compare against a specific value, and a trigger circuit evaluates trigger equations based on the outputs of probe comparators in its own clock domain. For example, the set of signals P0 may be compared to data values D0 in the clock domain clocked by Clk0, and the set of signals P1 may be compared to data values A0 in the clock domain clocked by Clk1.

Signals that are used to generate the trigger condition within each integrated logic analyzer are routed to a respective RAM. The data path to the RAM has a latency of a few clock cycles in order to compensate for the delay incurred in the trigger path as the data sample should coincide with a correct trigger mark. A trigger event occurring in the first stage of integrated logic analyzers results in an output signal to the second stage via the synchronizer circuit 118. In the example involving two clock domains, the number of signals to the second stage is two, one signal from each integrated logic analyzer in the first stage. In FIG. 2, the signals are labeled T0 from integrated logic analyzer 104 and T1 from integrated logic analyzer 106.

The register module contains read and write registers which can be read from and written to by debugger software 114. The functionality of other circuitry within the clock domains can be controlled by the debugger software through the registers in the register module. The registers include registers for configure match units, obtaining the status of the ILA while it is operating, and setting the number of samples to be captured.

The second stage integrated logic analyzer 108 evaluates trigger conditions occurring in multiple clock domains. P0' and P1' are synchronized trigger signals based on the T0 and T1 trigger signals from the integrated logic analyzers 104 and 106. The second stage integrated logic analyzer 108 uses the maximum of the clock signals of the clock domains and stores the states of the synchronized trigger signals along with trigger markers in RAM. In addition to the complexity of the synchronizer circuit and the resources required by the multiple integrated logic analyzers, the second stage integrated logic analyzer may fail to capture a combination of events occurring at the same time across multiple clock domains. The failure to capture a combination of events may be due to the frequency of one of the clock signals being so much slower than the frequency of the other clock signal that the trigger signal resulting from the signal probed by the slower clock domain is not asserted until after the trigger signal resulting from the signal probed at the faster clock signal has been de-asserted.

The disclosed systems and approaches reduce the circuit resources required for implementing the integrated logic analyzer, reduce the pipeline stages for storing samples in RAM, reliably capture events occurring in different clock domains, and are scalable across multiple clock domains with minimal user involvement.

Figure 3:
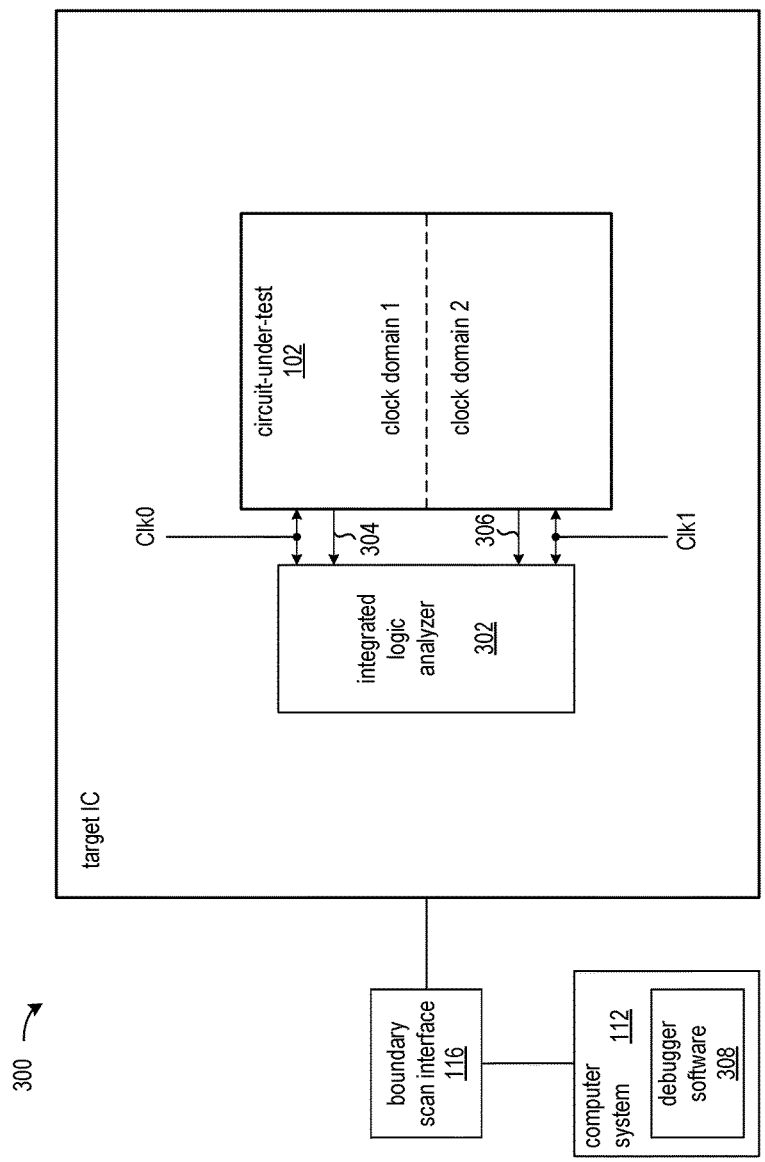
FIG. 3 shows a circuit diagram of a system in which a single integrated logic analyzer is used to probe circuit-under-test.

FIG. 3 shows a circuit diagram of a system 300 in which a single integrated logic analyzer 302 is used to probe circuit-under-test 102. The integrated logic analyzer 302 is coupled to the circuitry in clock domain 1 and to the circuitry in clock domain 2 of the circuit-under-test.

The signals of the circuit-under-test 102 that are to be probed and used for trigger signals are connected to the integrated logic analyzer 302, along with the clock signals used with the probe and trigger signals. The signals from clock domain 1 are shown by line 304, and the signals from clock domain 2 are shown by line 306. The integrated logic analyzer includes first-level comparator circuits (FIG. 4) that are clocked by the respective clock signals and that compare the input signals to specified values.

Figure 4:
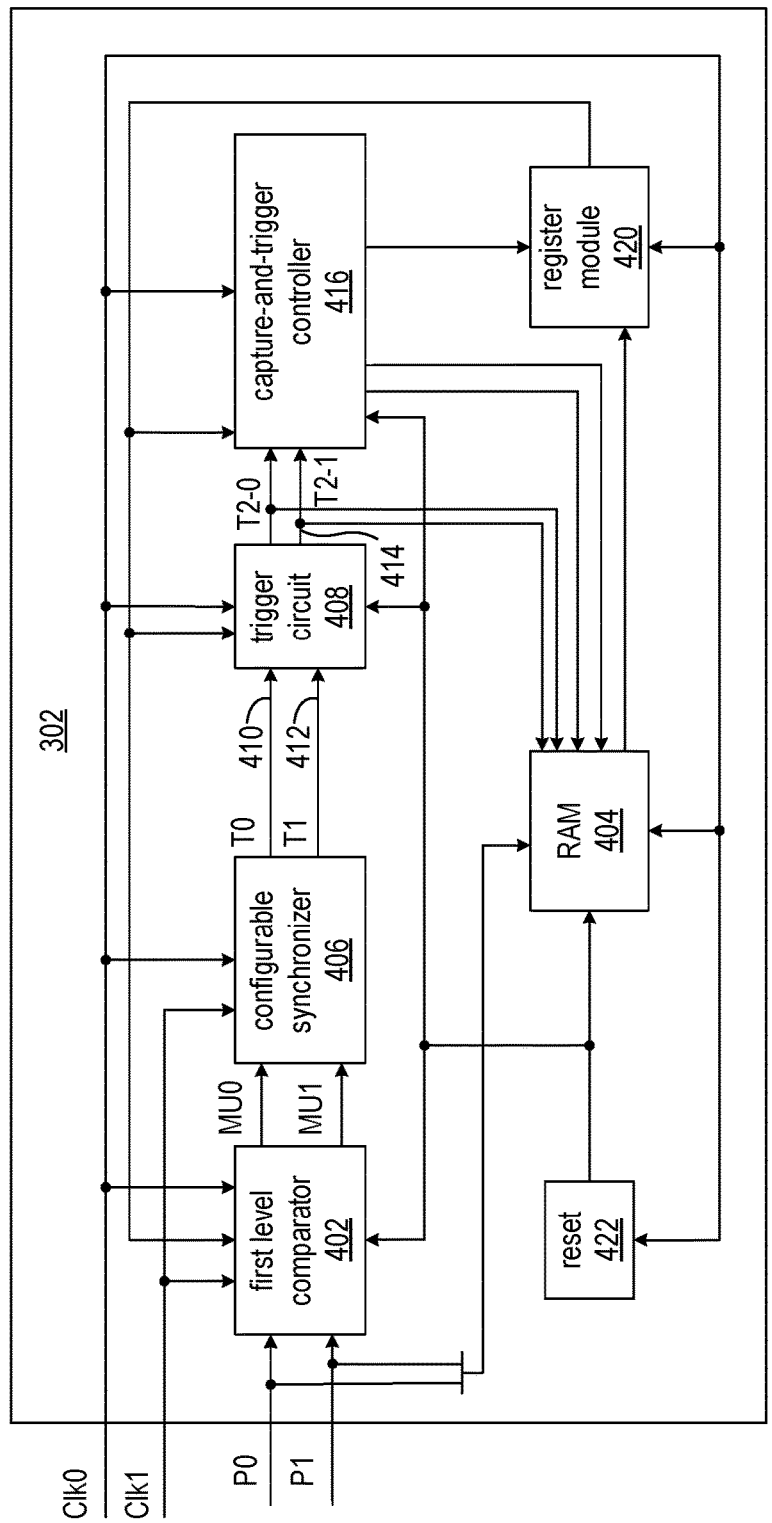
FIG. 4 shows a circuit diagram that illustrates an implementation of integrated logic analyzer.

The output signals from the first-level comparator circuits are trigger signals that are input to a configurable synchronizer circuit (FIG. 4). The configurable synchronizer circuit synchronizes the input trigger signals between the monitored clock domains. The configurable synchronizer circuit can be easily adapted to operate with different numbers of clock domains and clock signals having different frequency and phase relationships simply by inputting configuration data to the configurable synchronizer circuit. The configurable synchronizer circuit adapts its processing according to the input configuration data.

Figure 5:
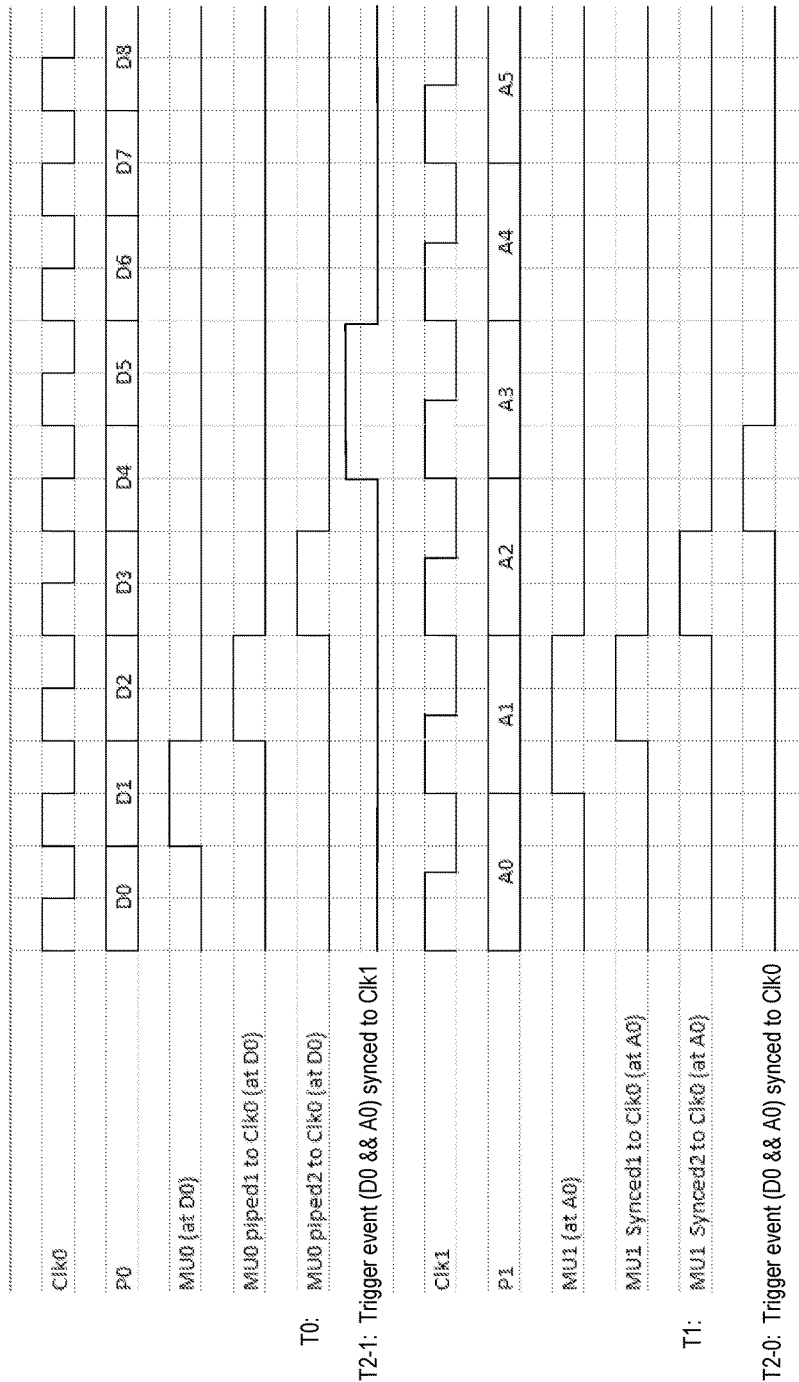
FIG. 5 shows a waveform diagram of clock, data, and trigger signals of the example circuitry of FIG. 4.

The integrated logic analyzer evaluates a trigger equation using the synchronized trigger signals and stores a trigger marker in the adjacent sampled data if the trigger equation is satisfied. Once the data is available, the debugger software 308 accounts for the frequency and phase relationship(s) between the clock signals and reads the captured data and displays the signals in a single waveform viewer as shown in FIG. 5.

FIG. 4 shows a circuit diagram that illustrates an implementation of integrated logic analyzer 302. The example implementation is directed to a debugging scenario in which signals from two clock domains of a circuit-under-test are to be probed. The line labeled P0 indicates a set of signals from the clock domain that uses Clk0 as the clock signal, and the line labeled P1 indicates a set of signals from the clock domain that uses Clk1 as the clock signal.

The P0 and P1 signals are input to first-level comparator circuits 402 and also to the data port(s) of RAM 404. The first-level comparator circuits include individual comparators for each signal in the sets P0 and P1 of signals. The comparators are also connected to the associated one of clock signals Clk0 and Clk1 and compare the input signals to specified values (e.g., logic 1).

The unsynchronized trigger signals MU0 and MU1, which are clocked according to their respective clock domains, from the first-level comparator circuits 402 are provided as inputs to the configurable synchronizer circuit 406. The configurable synchronizer circuit synchronizes the trigger signal MU0 to Clk1 and MU1 to Clk0 and the synchronized trigger signals T0 and T1 are output to the trigger circuit 408. In the example, the frequency of Clk0 is greater than the frequency of Clk1. The synchronized trigger signal resulting from MU0 is labeled T0 on line 410, which is MU0 piped to Clk0, and the synchronized trigger signal resulting from MU1 is labeled T1 on line 412, which is MU1 synchronized to Clk0. If the trigger condition does not involve signals from both clock domains, only one synchronizer will be used.

The trigger circuit operates with respective clock signals from the clock domains from which the trigger signals are sourced. The trigger circuit can be configured with trigger equations to evaluate signals within a single clock domain or evaluate signals between two or more clock domains. In the exemplary integrated logic analyzer 302, an equation that can be formed among the signals across the two clock domains of Clk0 and Clk1 is (P0==A0) && (P1==D0), which is equivalent to T0 && T1.

The trigger circuit evaluates the configured trigger equation based on the states of the synchronized trigger signals on lines 410 and 412. The state of the final trigger signals, labeled T2-0 and T2-1, on line 414 depends on evaluation of the trigger equation (e.g., logic 1 or logic 0). T2-0 is the final trigger signal synchronized to Clk0, and T2-1 is the final trigger signal synchronized to Clk1. The final trigger signals T2-0 and T2-1 are input to the capture-and-trigger controller 416 and to the data port of the RAM 404.

The capture-and-trigger controller 416 controls storing the trigger mark in the RAM 404 in association with the sampled P0 and P1 in the RAM 404. The capture-and-trigger controller generates the addresses and write enable signals for storing the data samples of the probed signals in the RAM. The capture-and-trigger controller generates address values at a rate that corresponds to the highest frequency of the input clock signals. For example, if Clk0 is 100 MHz, Clk1 is 200 MHz, and Clk0 and Clk1 are phase synchronous, then the capture controller generates addresses such that for every two samples of data at the clock frequency of 200 MHz, one sample of data at the clock frequency of 100 MHz is stored in the RAM. The process of address generation begins with the start of a comparison operation and continues until all the samples are correctly stored in the memory. For clock frequencies that are non-integer multiples or phase asynchronous, the samples are stored in separate RAMs that are clocked by the respective clock signals, and the debugger software 114 merges the samples from the RAMS when rendering waveform diagrams. In generating addresses, the capture controller 416 uses the RAM 404 as a circular buffer. For example, the number of samples needed may be 1024 and the trigger condition may occur after 4096 clock cycles of operation of the circuit-under-test. When the integrated logic analyzer begins evaluating signals for the trigger condition, the capture controller block generates addresses from 0 to 1024 and rolls over for 4 times until trigger condition is met. Once the condition is satisfied at the 4096'th sample, the capture controller will address and enable storage of 1024 samples in the memory and stop storing data once 1024 samples have been collected.

The capture-and-trigger controller signals the trigger capture circuit that the trigger equation has been satisfied. In response to the signal from the trigger circuit that the trigger equation has been satisfied, the capture-and-trigger controller generates a trigger mark and outputs the trigger mark to a data port of the RAM 404. The trigger mark may be a value that identifies the trigger equation that was satisfied, and the trigger mark can be stored at an address that immediately precedes the addresses at which the samples of the probed signals are stored. Separate trigger marks are generated and stored for each different domain from which a trigger signal was sourced.

The capture-and-trigger controller 416 does not require the delayed storage of data samples as do the integrated logic analyzers 104, 106, and 108 of FIG. 2. The debugging software 308 (FIG. 3) can decode the trigger marks and data samples according to the frequency information when reading the data samples and trigger marks from the RAM.

For circuits under test having clock signals that are in phase, a single RAM can be used to store samples at the frequency of the clock signal having the greatest frequency of the clock signals. For circuits under test having clock signals that are not in phase, multiple RAMs can be used to store samples associated with the out-of-phase clock signals. For a circuit-under-test having some clock signals that are in phase and other clock signals that are out of phase, one RAM can be used for the samples associated with the in phase clock signals, and separate RAMS can be used to store samples associated with the out-of-phase clock signals. Multiple trigger marks can be generated from a single trigger output. When a trigger condition is satisfied, trigger marks are stored in the RAM blocks in the respective clock domains. The trigger marks can subsequently be used by runtime software to retrieve the sample values to re-construct the waveform with proper placement of trigger on signals across different clock domains.

Configuration data affecting operation of the integrated logic analyzer 302 is stored in the register module 420, which is connected to the first-level comparator 402, configurable synchronizer 406, trigger circuit 408, and capture-and-trigger controller 416. The configuration data includes frequencies of the input clock signals and phase relationships of the input clock signals. The register module contains read and write registers which can be read from and written to by debugger software 114. The functionality of other circuitry within the clock domains can be controlled by the debugger software through the registers in the register module. The registers include registers for configure match units, obtaining the status of the ILA while it is operating, and setting the number of samples to be captured. The reset circuit 422 is connected to all components for resetting the circuits to an initial state. The reset circuit is also used to send a reset signal to the different clock domains of the circuit-under-test.

FIG. 5 shows a waveform diagram of clock, data, and trigger signals of the example circuitry of FIG. 4. The waveforms illustrate how the configurable synchronizer circuit 406 of FIG. 4 synchronizes the trigger signals from the first level comparator circuitry 402 and the capture of a trigger event that occurs across clock domains.

In the example, the frequency of Clk0 is 1.5× frequency of Clk1. For example, the frequency of Clk0 could be 300 MHz, and the frequency of Clk1 could be 200 MHz. Samples of the P0 signal are D0, D1, D2, . . . , and samples of the P1 signal are A0, A1, A1, . . . .

The first level comparator circuitry 402 of FIG. 4 asserts the MU0 trigger signal for one cycle of Clk0 upon detecting the D0 data value. Similarly, the first level comparator circuitry asserts the MU1 trigger signal for one cycle of CLK1 upon detecting the A0 data value.

The configurable synchronizer circuit 406 of FIG. 4 synchronizes MU0 to Clk1 and MU1 to Clk0. Two cycles of MU0 at the rate of Clk0 are needed to cover the duration of MU1 as the rate of Clk0 is 1.5 times the rate of Clk1. Thus, the configurable synchronizer circuit pipelines the MU0 signal for two cycles, with output of the first stage of the pipeline shown as "MU0 piped1 to Clk0," and output of the second stage of the pipeline shown as "MU1 piped 2 to Clk0." The output of the second stage is the output trigger signal for MU0 from the configurable synchronizer circuit. Additional pipeline stages would be implemented in an example involving a greater difference between the frequencies of Clk0 and Clk1 and to account for mean time between failures (MTBFs).

The configurable synchronizer circuit synchronizes the MU1 signal to Clk0 as shown by the signal labeled "MU1 Synced1 to Clk0." The signal "MU1 Synced1 to Clk0" is asserted for one cycle of Clk0.

To allow evaluation of a trigger equation based on both MU0 and MU1, the "MU1 Synced1 to Clk0" signal is pipelined for one additional cycle of Clk0, as shown by "MU1 Synced2 to Clk0." The pipelining aligns the timing of "MU0 piped2 to Clk0" and "MU1 Synced2 to Clk0" for output from the configurable synchronizer circuit.

The trigger circuit 408 of FIG. 4 evaluates a trigger equation based on the synchronized trigger signals from the configurable synchronizer circuit. In the example of FIG. 5, the trigger equation is D0 && A0. The synchronized "MU0 piped2 to Clk0" and "MU1 Synced2 to Clk0" signals from the configurable synchronizer circuit indicate the states of the P0 and P1 at the first-illustrated cycles of Clk0 and Clk1. Upon detecting both the "MU0 piped2 to Clk0" and "MU1 Synced2 to Clk0" signals asserted in the same cycle of Clk0, the trigger circuit asserts the "Trigger event" signals (also referred to as the "final trigger signals") and shown as T2-0 (the final trigger signal synchronized to Clk0) and T2-1 (the final trigger signal synchronized to Clk1 using similar synchronization and pipelining in the Clk1 domain).

Figure 6:
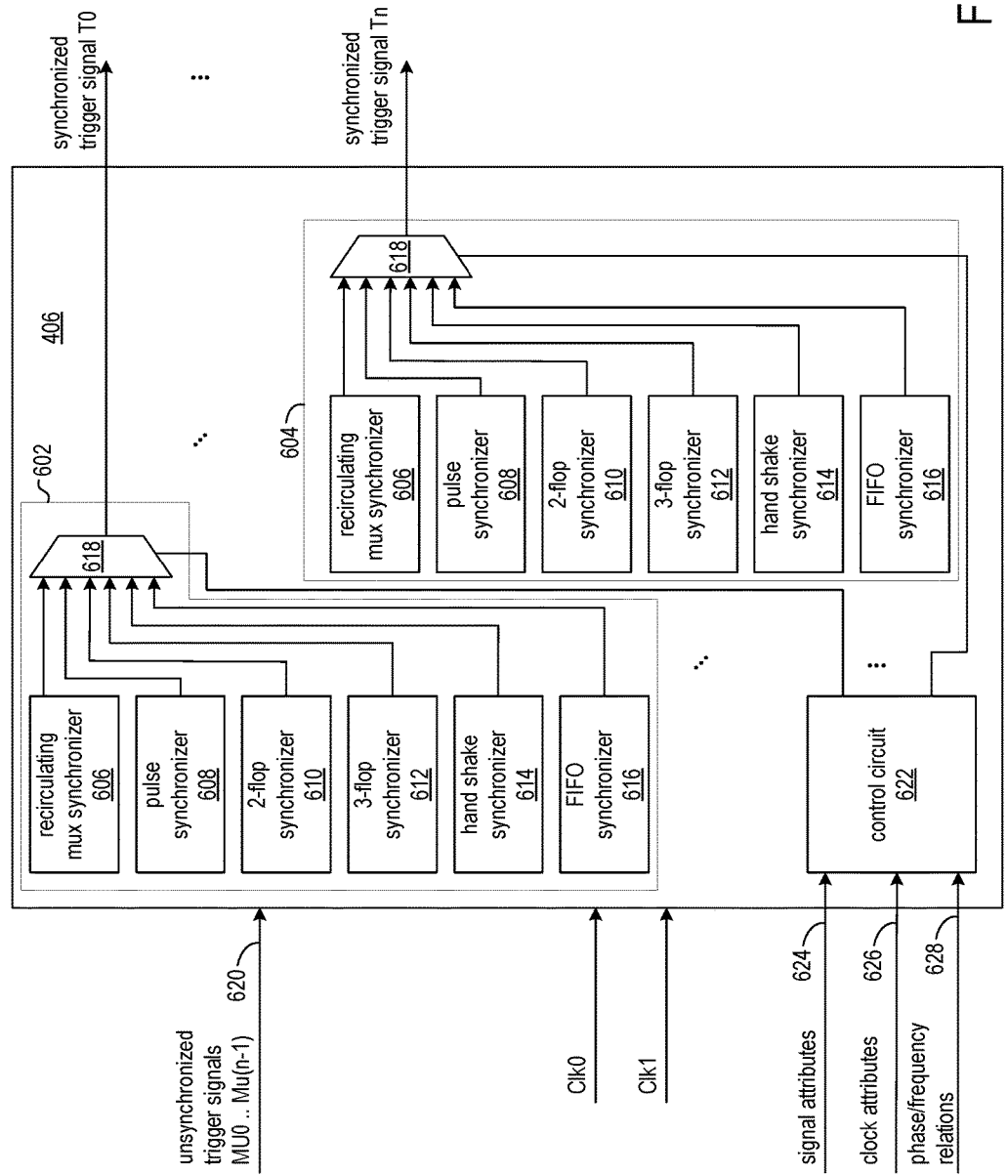
FIG. 6 shows an example of a configurable synchronizer circuit.

FIG. 6 shows an example of a configurable synchronizer circuit 406 according to the example circuit-under-test of FIG. 3. The example of FIG. 3 involves two clock signals, Clk0 and Clk1. For each unsynchronized trigger signal to be synchronized, the configurable synchronizer has or enables an instance of a multi-synchronizer circuit. Instances of an exemplary multi-synchronizer circuit include instances 602 and 604. Each instance of the multi-synchronizer circuit includes multiple, different synchronizer circuits. For example, instances 602 and 604 each include a recirculating mux synchronizer 606, a pulse synchronizer 608, a 2-flop synchronizer 610, a 3-flop synchronizer 612, a hand shake synchronizer 614, a FIFO synchronizer 616, and a multiplexer 618. Other implementations may have more or fewer synchronization circuits.

In the example of FIG. 4, trigger signals T0 and T1 are sourced from the clock domains of Clk0 and Clk1, respectively. For the example of FIG. 4, the configurable synchronizer circuit 406 would have two instances of the multi-synchronizer circuit. If Clk0 is faster than Clk1, then one instance would output T0 and the other instance would output T1. T0 would be synchronized to Clk1, and T1 would be synchronized to Clk0.

The trigger input signal line 620 carries n unsynchronized trigger signals, MU0-MU(n−1). The unsynchronized trigger signal line is connected to each of the recirculating mux synchronizer 606, pulse synchronizer 608, 2-flop synchronizer 610, 3-flop synchronizer 612, hand shake synchronizer 614, and FIFO synchronizer 616. The input clock signals, such as Clk0 and Clk1, which in an example application can be transmit (Tx) and receive (Rx) clock signals, are also connected to each of the recirculating mux synchronizer, pulse synchronizer, 2-flop synchronizer, 3-flow synchronizer, hand shake synchronizer, and FIFO synchronizer.

Each of the recirculating mux synchronizer, pulse synchronizer, 2-flop synchronizer, 3-flop synchronizer, and hand shake synchronizer synchronizes one of the unsynchronized trigger signals MU0-MUn to the clock signal in one of the other clock domains from which the trigger signals are sourced. The output of each of the recirculating mux synchronizer, pulse synchronizer, 2-flop synchronizer, 3-flop synchronizer, hand shake synchronizer, and FIFO synchronizer is a synchronized trigger signal, which is input to the multiplexer 618. For example, the recirculating mux synchronizer, pulse synchronizer, 2-flop synchronizer, 3-flop synchronizer, and hand shake synchronizer of multi-synchronizer circuit 602 synchronize MU0 to Clk1, and the recirculating mux synchronizer, pulse synchronizer, 2-flop synchronizer, 3-flop synchronizer, and hand shake synchronizer of multi-synchronizer circuit 604 synchronize MU1 to Clk0.

Each instance of the multiplexer 618 is controlled by control circuit 622. In controlling the selection of a synchronized trigger signal by each of the instances of the multiplexer 618, the control circuit inputs trigger signal attributes on line 624, clock signal attributes on line 626, and phase/frequency relationships on line 628. The trigger signal attributes indicate signal width and signal type, for example. The clock signal attributes indicate for each clock signal whether the clock signal is synchronous or asynchronous, the frequency of the clock signal, and the source of the clock generator. The phase/frequency relations specify phase relationships and frequency relationships between the clock signals. In implementing the configurable synchronizer circuit on a programmable IC, any one or more of the circuits 606, 608, 610, 612, 614, and 616 can be used depending on the attributes supplied and nature/number of the trigger signals/clocks. For example, only a 2-flop synchronizer would be used if the transmit (Tx) clock is the same as receive (Rx) clock, but the phase is asynchronous and a single trigger signal is used. Other synchronizers would not be implemented inside the configurable synchronizer circuit in this case.

Table 1 below illustrates examples of combinations of trigger signal attributes, clock signal attributes, and phase/frequency relations that can be used by the control circuit in selecting synchronized trigger signals from the recirculating mux synchronizer, pulse synchronizer, 2-flop synchronizer, 3-flop synchronizer, hand shake synchronizer, and FIFO synchronizer. The first five columns show combinations of attributes, and the last column shows the synchronizer selected in response to those attributes. Though specific frequencies, frequency relations, phases, signal widths signal types, and synchronizer circuits are shown, those skilled in the art will recognize that the values are exemplary only and that different values and/or synchronizers may be suitable for different integrated circuit technologies and process parameters.

Figure 7:
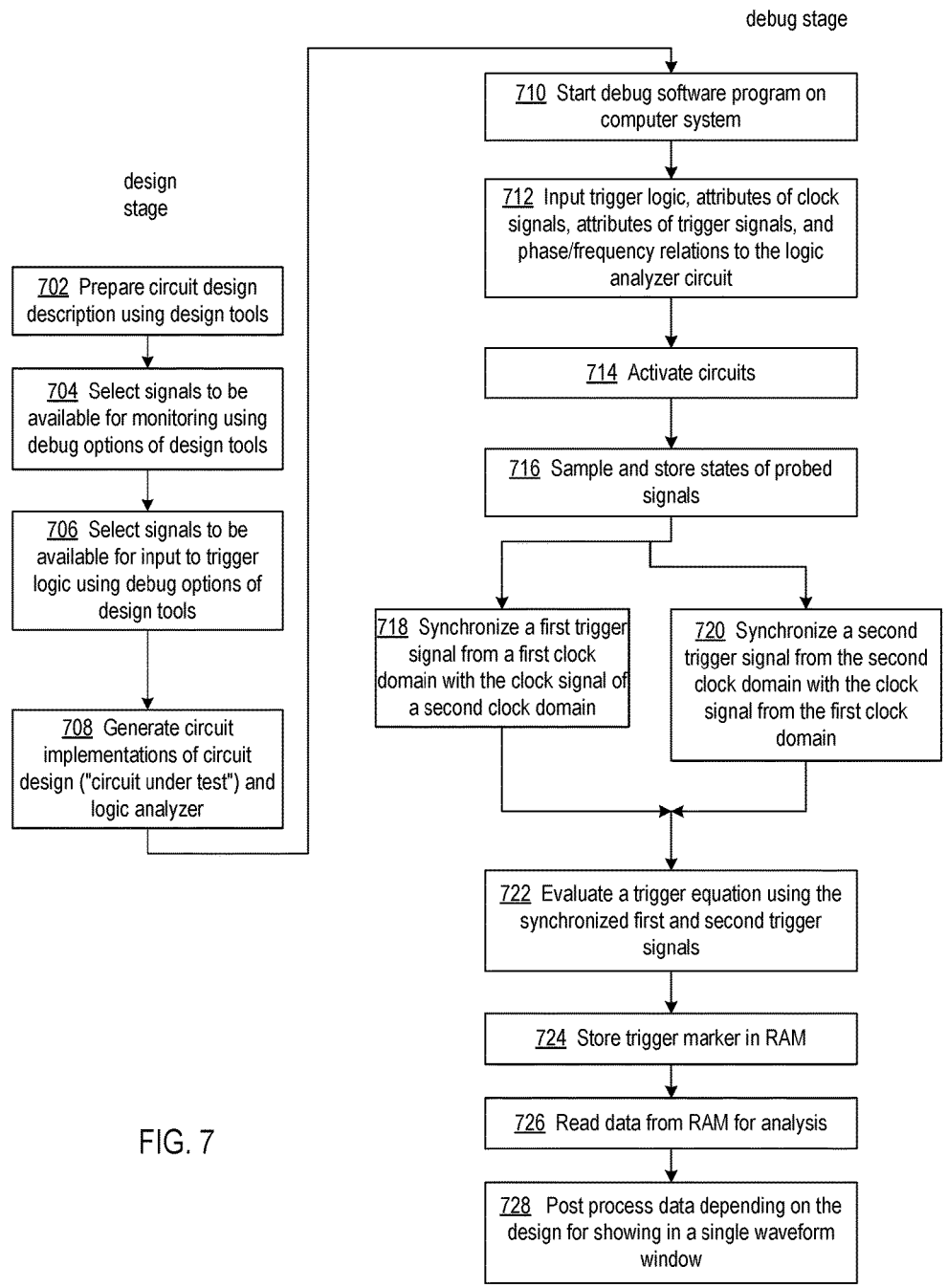
FIG. 7 shows a process of preparing a circuit design and debugging the circuit design according to some implementations.

FIG. 7 shows a process of preparing a circuit design and debugging the circuit design according to some implementations. The process may be viewed as including a design stage and a debug stage. During the design stage, the circuit design is prepared and adapted for debugging, and during the debugging stage, the implemented circuit-under-test is operated and signals selected and states sampled according to the parameters specified by the designer.

At block 702, the designer prepares a circuit design using customary electronic design automation (EDA) tools. In preparing the circuit design, at block 704 an analysis function of the EDA tools inputs data specified by the designer to indicate those signals of the circuit design that are to be eligible to be probed during the debug stage. At block 706, the analysis function of the EDA tools inputs from the designer, data that specifies signals of the circuit design that are to be eligible to be trigger signals during the debug stage.

At block 708, the EDA tools generate circuit implementations of the circuit design and the logic analyzer circuit. The implementation of the circuit design may be referred to as the "circuit-under-test." In generating the circuit-under-test and logic analyzer circuit, in some implementations the EDA tools generate configuration data for configuring a programmable IC and configure the programmable IC with the configuration data. The logic analyzer circuit is coupled to the circuit-under-test and inputs the probe-eligible and trigger-eligible signals.

The debug stage commences at block 710, at which a debugger program begins execution on a computer system that is coupled to the circuit-under-test. The debugger program may communicate with the logic analyzer circuit via a boundary scan interface, for example. It will be appreciated that various alternative computing arrangements, including one or more processors and a memory arrangement configured with program code, would be suitable for hosting the debugger program. The computer code, which implements the debugger program and is executable by a computer processor, may be stored and provided via a variety of computer-readable storage media or delivery channels such as magnetic or optical disks or tapes, electronic storage devices, or as application services over a network.

At block 712, the debugger program inputs from the designer, data that specifies trigger logic, attributes of clock signals, attributes of trigger signals, and phase/frequency relations of the clock signals. The trigger logic identifies

TABLE 1

| Frequency Relation | Phase | Signal width | Condition | Signal type | Synchronizer |
|---|---|---|---|---|---|
| Tx Clock = Rx Clock or 1.5 × Tx Clock <= Rx Clock | Synchronous/ Asynchronous | 1 bit | slow frequencies, typically < 400 MHz | Level/ pulse | 2-flop synchronizer |
| Tx Clock = Rx Clock or 1.5 × TxClk <= Rx Clock | Synchronous/ Asynchronous | 1 bit | slow frequencies, typically > 400 MHz | Level/ pulse | 3-flop synchronizer |
| Tx Clock = Rx Clock | Asynchronous | >1 bit | | data | FIFO synchronizer |
| Tx Clock != Rx Clock | Asynchronous | 1 bit | | pulse | Pulse synchronizer |
| Tx Clock != Rx Clock | Synchronous/ Asynchronous | >1 bit | Multiple bits are changing at a time | data | Hand Shake Synchronizer |
| Tx Clock != Rx Clock | Synchronous/ synchronous | >1 bit | Data should be stable until it is sampled in Destination Domain | data | Recirculating Mux Synchronizer | trigger signals and a Boolean expression involving the states of the trigger signals, for example.

The circuit-under-test and logic analyzer circuit are activated and operated at block 714. Activation and operation of the circuits entails applying clock signals and inputting data signals to the circuit-under-test. The probed signals are sampled and the states of the probed signals are stored in RAM at block 716.

Trigger signals from different clock domains are synchronized at blocks 718 and 720. In an example, involving a first trigger signal from a first clock domain and a second trigger signal from a second clock domain, at block 718, one instance of the multi-synchronizer circuit synchronizes the first trigger signal from the first clock domain with the clock signal of the second clock domain. At block 720, another instance of the multi-synchronizer circuit synchronizes the trigger signal from the second clock domain with the clock signal of the first clock domain. In an example involving three trigger signals from three clock domains having clock signals Clk0, Clk1, and Clk2 and Clk0 being the fastest clock signal, the trigger signals from the Clk1 and Clk2 clock domains are synchronized to Clk0, and the trigger signal from the Clk0 clock domain is synchronized to the Clk1 and Clk2 clock domains. The multi-synchronizer circuits select synchronized trigger signals from the constituent synchronizer circuits based on the attributes of the clock signals, attributes of the trigger signals, and phase/frequency relations of the clock signals input at block 712.

At block 722, the user-specified trigger equation is evaluated according to the states of the synchronized trigger signals and a final trigger signal is generated to indicate the result of evaluating the trigger equation. If the trigger equation evaluates to true, at block 724, a trigger marker is stored in the RAM to indicate that the states of the trigger signals input concurrent with the sampled and stored data satisfied the trigger equation and the sampled and stored data are associated with the satisfied trigger equation.

At block 726, the debugger program reads the stored sampled states using customary functions of the debugger program, and at block 728 the debugger program uses the frequency and phase relationships of the clock signals of the clock domains from which the signals were probed to process the sampled data and display the sampled data, the different clock signals, and the trigger signals in a single waveform window.

Though the disclosed examples involve probing signals from multiple clock domains based on trigger signals from multiple clock domains, those skilled in the art will recognize that the disclosed approaches may be used to probe signals from one or more clock domains when the trigger equation condition references a trigger signal from a single clock domain. The traditional approach of FIGS. 1 and 2 does not provide this capability.

Figure 8:
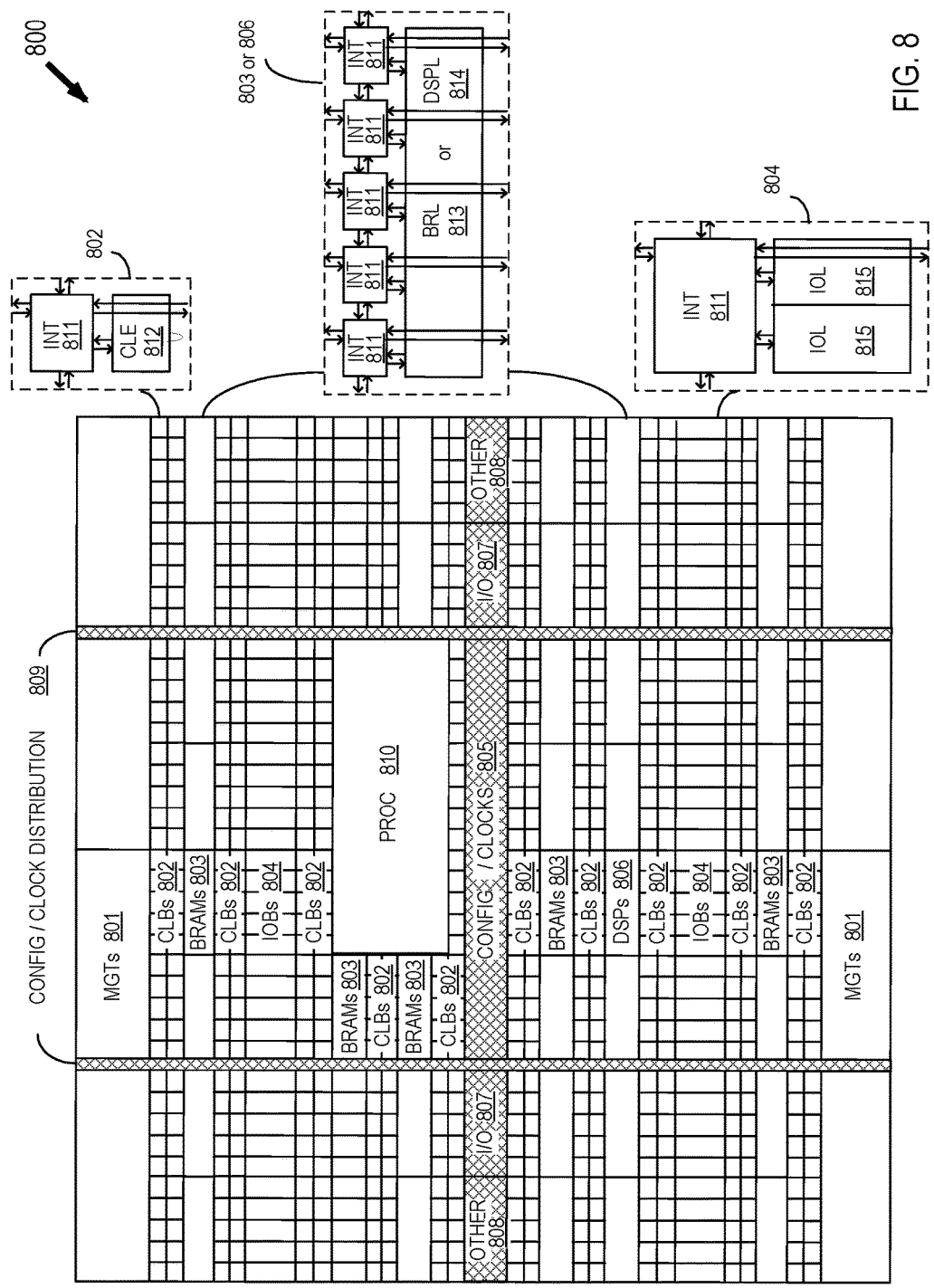
FIG. 8 shows a programmable integrated circuit (IC) on which the disclosed integrated logic analyzer and circuit-under-test may be implemented.

FIG. 8 shows a programmable integrated circuit (IC) 800 on which the disclosed integrated logic analyzer and circuit-under-test may be implemented. The programmable IC may also be referred to as a System On Chip (SOC) that includes field programmable gate array logic (FPGA) along with other programmable resources. FPGA logic may include several different types of programmable logic blocks in the array. For example, FIG. 8 illustrates programmable IC 800 that includes a large number of different programmable tiles including multi-gigabit transceivers (MGTs) 801, configurable logic blocks (CLBs) 802, random access memory blocks (BRAMs or UltraRAMs in XILINX FPGAs) 803, input/output blocks (IOBs) 804, configuration and clocking logic (CONFIG/CLOCKS) 805, digital signal processing blocks (DSPs) 806, specialized input/output blocks (I/O) 807, for example, clock ports, and other programmable logic 808 such as digital clock managers, analog-to-digital converters, system monitoring logic, and so forth. Some programmable IC having FPGA logic also include dedicated processor blocks (PROC) 810 and internal and external reconfiguration ports (not shown).

In some FPGA logic, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA logic. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic, plus a single programmable interconnect element INT 811. A BRAM 803 (or an "Ultra RAM" in other technologies) can include a BRAM logic element (BRL) 813 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 806 can include a DSP logic element (DSPL) 814 in addition to an appropriate number of programmable interconnect elements. An 10B 804 can include, for example, two instances of an input/output logic element (IOL) 815 in addition to one instance of the programmable interconnect element INT 811. As will be clear to those of skill in the art, the actual I/O bond pads connected, for example, to the I/O logic element 815, are manufactured using metal layered above the various illustrated logic blocks, and typically are not confined to the area of the input/output logic element 815.

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 8 include additional logic blocks that disrupt the regular columnar structure making up a large part of the programmable IC. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary programmable IC architecture. The number of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual programmable IC, more than one adjacent column of CLBs is typically included wherever the CLBs appear, to facilitate the efficient implementation of user logic.

The various terminology used in the Specification (including claims) should be given their ordinary plain meaning in the art unless otherwise indicated. As examples, the Specification describes and/or illustrates aspects useful for implementing the various embodiments by way of circuits or circuitry. In some instances, the configuration of the circuitry can be described and illustrated using, for example, blocks, modules, devices, systems, units, controllers, or engines. Such circuits or circuitry can be discussed in relation to how they are used together and with other elements in order to describe certain embodiments relative to their related structures, steps, functions, or operations. For example, in certain of the above-discussed embodiments, one or more of the blocks, modules, devices, systems, units, controllers, or engines are discrete logic circuits or programmable logic circuits configured and arranged for implementing these operations/activities, as may be carried out consistent with the approaches shown in the drawings. In certain embodiments, the various blocks, modules, devices, systems, units, controllers, or engines can be implemented using one or more computer processing circuits and memory circuitry. The memory circuitry can store and access a set (or sets) of instructions (and/or to be used as configuration data to define how the computer processing circuit is to perform), which can be executed in order to implement an algorithm or process as described in the disclosure.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for debugging circuits. Other aspects and features will be apparent to those skilled in the art from consideration of the specification. It is intended that the specification and drawings be considered as examples only, with a true scope of the invention being indicated by the following claims.

What is claimed is:

1. A circuit for probing signals in a plurality of clock domains, comprising:
    a plurality of instances of a multi-synchronizer circuit, wherein each instance of the multi-synchronizer circuit is configured to input a respective unsynchronized trigger signal from a respective one of the plurality of clock domains and includes:
        a plurality of synchronizer circuits, each synchronizer circuit of the plurality of synchronizer circuits configured to synchronize the respective unsynchronized trigger signal with one clock signal from the plurality of clock signals and to output a synchronized trigger signal, and
        control circuitry coupled to the plurality of synchronizer circuits and configured to select the synchronized trigger signal from one of the plurality of synchronizer circuits as a respective synchronized trigger signal;
    a trigger circuit coupled to the plurality of instances of the multi-synchronizer circuit and configured to evaluate a trigger equation based on states of the respective synchronized trigger signals and output a final trigger signal based on evaluation of the trigger equation;
    a memory having a data port coupled to input data indicative of states of the signals in the plurality of clock domains;
    a capture controller circuit coupled to the memory and to the trigger circuit and configured to:
        generate addresses to an address port of the memory; and
        store a trigger marker in the memory in response to a state of the final trigger signal.

2. The circuit of claim 1, wherein each synchronizer circuit in each instance of the multi-synchronizer circuit implements a synchronization technique that is different from the synchronization technique implemented by each other synchronizer circuit in the instance.

3. The circuit of claim 2, wherein the plurality of synchronizer circuits in each multi-synchronizer circuit include two or more synchronizer circuits from a group of synchronizer circuits including a recirculating mux synchronizer, a pulse synchronizer, a 2-flop synchronizer, a 3-flop synchronizer, a hand shake synchronizer, and a FIFO synchronizer.

4. The circuit of claim 1, wherein the control circuitry includes:
    a multiplexer coupled to input synchronized trigger signals from the plurality of synchronizer circuits; and
    a control circuit coupled to a control pin of the multiplexer, wherein the control circuit is configured to input signal attributes and generate a control signal to the multiplexer to select one of the synchronized trigger signals as the respective trigger signal in response to the signal attributes.

5. The circuit of claim 4, wherein the attributes include attributes of the clock signals.

6. The circuit of claim 5, wherein the attributes of the clock signals include one or more of frequency, synchronous-asynchronous status, phase relationship, and frequency relationship.

7. The circuit of claim 4, wherein the attributes include attributes of the unsynchronized trigger signal.

8. The circuit of claim 7, wherein the attributes of the unsynchronized trigger signal include signal width.

9. The circuit of claim 1, wherein each synchronizer circuit of the plurality of synchronizer circuits is further configured to delay the respective synchronized trigger signal.

10. The circuit of claim 4, wherein the attributes include attributes of the clock signals and attributes of the unsynchronized trigger signal.

11. A method of probing signals in a plurality of clock domains, comprising:
    inputting respective unsynchronized trigger signals from a plurality of clock domains to a plurality of instances of a multi-synchronizer circuit, each instance of the multi-synchronizer circuit including a plurality of synchronizer circuits, and the plurality of clock domains clocked by respective clock signals;
    synchronizing, by one or more of the plurality of synchronizer circuits in each instance of the multi-synchronizer circuit, the respective unsynchronized trigger signal with one clock signal from the plurality of clock domains;
    selecting output of one of the one or more synchronizer circuits in each instance of the multi-synchronizer circuit, as a respective synchronized trigger signal;
    evaluating a trigger equation based on a state of each respective synchronized trigger signal;
    generating a final trigger signal based the evaluating of the trigger equation;
    storing a trigger marker in a memory in response to a state of the final trigger signal; and
    storing states of probed signals in the memory.

12. The method of claim 11, wherein the synchronizing by the one or more of the plurality of synchronizer circuits in each instance of the multi-synchronizer circuit includes synchronizing by one of the one or more of the plurality of synchronizer circuits using a synchronization technique that is different from a synchronization technique used by each other synchronizer circuit in the instance.

13. The method of claim 12, wherein the synchronizing by the one or more of the plurality of synchronizer circuits in each instance of the multi-synchronizer circuit includes synchronizing by one or more of a recirculating mux synchronizer, a pulse synchronizer, a 2-flop synchronizer, a 3-flop synchronizer, a hand shake synchronizer, or a FIFO synchronizer.

14. The method of claim 11, further comprising:
inputting synchronized trigger signals from the plurality of synchronizer circuits to a multiplexer; and
inputting signal attributes to a control circuit;
wherein the selecting includes generating a control signal by the control circuit to the multiplexer to select one of the synchronized trigger signals as the respective trigger signal in response to the signal attributes.

15. The method of claim 14, wherein the signal attributes include attributes of the respective clock signals.

16. The method of claim 15, wherein the attributes of the respective clock signals include one or more of frequency, synchronous-asynchronous status, phase relationship, and frequency relationship.

17. The method of claim 14, wherein the attributes include attributes of the unsynchronized trigger signal.

18. The method of claim 17, wherein the attributes of the unsynchronized trigger signal include signal width.

19. The method of claim 11, wherein the synchronizing by the one or more of the plurality of synchronizer circuits in each instance of the multi-synchronizer circuit includes delaying the respective synchronized trigger signal.

20. The method of claim 11, further comprising:
reading the states of the probed signals from the memory; and
displaying the states of the probed signals in a waveform window based on frequency and phase relationships of the respective clock signals.

* * * * *